(12) United States Patent
Scocchetti

(10) Patent No.: US 11,726,137 B2
(45) Date of Patent: Aug. 15, 2023

(54) THERMAL CONDITIONING OF ELECTRONIC DEVICES UNDER TEST BASED ON EXTENSIBLE ELEMENTS

(71) Applicant: ELES Semiconductor Equipment S.p.A., Todi (IT)

(72) Inventor: Fabrizio Scocchetti, Todi (IT)

(73) Assignee: ELES SEMICONDUCTOR EQUIPMENT S.P.A., Todi (IT)

( * ) Notice: Subject to any disclaimer, the term of this patent is extended or adjusted under 35 U.S.C. 154(b) by 74 days.

(21) Appl. No.: 17/611,842

(22) PCT Filed: May 15, 2020

(86) PCT No.: PCT/IT2020/050121
§ 371 (c)(1),
(2) Date: Nov. 16, 2021

(87) PCT Pub. No.: WO2020/234907
PCT Pub. Date: Nov. 26, 2020

(65) Prior Publication Data
US 2022/0214396 A1 Jul. 7, 2022

(30) Foreign Application Priority Data
May 17, 2019 (IT) .......................... 102019000006974

(51) Int. Cl.
*G01R 31/28* (2006.01)

(52) U.S. Cl.
CPC ..... *G01R 31/2863* (2013.01); *G01R 31/2874* (2013.01)

(58) Field of Classification Search
CPC ............ G01R 31/2831; G01R 31/2874; G01R 31/2877
See application file for complete search history.

(56) References Cited

U.S. PATENT DOCUMENTS

| | | | |
|---|---|---|---|
| 2003/0030430 A1* | 2/2003 | Pfahnl | G01R 31/2874 324/750.09 |
| 2007/0288823 A1 | 12/2007 | Di Stefano et al. | |
| 2009/0183866 A1* | 7/2009 | Sakaue | G05D 23/1904 165/287 |
| 2010/0141287 A1 | 6/2010 | Scocchetti | |
| 2015/0122469 A1 | 5/2015 | Jensen et al. | |

OTHER PUBLICATIONS

International Searching Authority, "International Search Report and Written Opinion from PCT Application No. PCT/IT2020/050121", dated Aug. 11, 2020, pp. 1 through 9, Published: WO.

* cited by examiner

*Primary Examiner* — Tung X Nguyen
(74) *Attorney, Agent, or Firm* — Volpe Koenig (57) ABSTRACT

A thermal conditioning device (100) is proposed, wherein a process heat-conductive fluid (110) is caused to circulate in a plurality of extensible elements (105); a pressure of the process heat-conductive fluid (110) is regulated to lengthen the extensible elements (105) so that they are pressed against corresponding electronic devices under test (205) for conditioning them thermally. A test apparatus (200) comprising this thermal conditioning device (100) is also proposed. Moreover, a corresponding method for condition electronic devices under test (105) thermally and a corresponding method for testing electronic devices (205) are proposed.

15 Claims, 7 Drawing Sheets

THERMAL CONDITIONING OF ELECTRONIC DEVICES UNDER TEST BASED ON EXTENSIBLE ELEMENTS

This application claims priority to International Patent Application No. PCT/IT2020/050121 filed on May 15, 2020, which claims priority to Italian Patent Application No. 102019000006974 filed on May 17, 2019.

TECHNICAL FIELD

The present invention relates to the field of the test of electronic devices. More specifically, this invention relates to the thermal conditioning of electronic devices under test.

TECHNOLOGICAL BACKGROUND

The background of the present invention is hereinafter introduced with the discussion of techniques relating to its context. However, even when this discussion refers to documents, acts, artifacts and the like, it does not suggest or represent that the discussed techniques are part of the prior art or are common general knowledge in the field relevant to the present invention.

The electronic devices (for example, each based on one or more integrated circuits) are generally subject to tests to verify their correct operation. For each electronic device under test (also known as Device Under Test, or DUT), the tests are aimed at identifying defects that are either evident (i.e., which occur immediately) or potential (i.e., which might occur after a short period of use of the electronic device). In the latter case, the electronic devices may be subject to a thermal (burn-in) test. For this purpose, the electronic devices may be tested under thermal stress conditions, making them work at very high or very low temperatures (for example, from −50° C. to +150° C.), thereby simulating a long period of operation of the same electronic devices at room temperature (for example, 10-30° C.).

Particularly, the electronic devices may be tested in their final form at package level, i.e., with the integrated circuits encapsulated in packages to protect them and to provide terminals of access thereto. In this case, the electronic devices are temporarily housed on test boards (for example, Burn-In Boards, or BIBs, in case of the burn-in test). The test boards are used to interface the electronic devices with a test system. For this purpose, each test board is provided with a plurality of sockets. Each socket mechanically locks the package of an electronic device and electrically connects its terminals to the test system; at the same time, the socket allows removing the electronic device without substantial damage at the end of the test. The sockets are generally arranged in a matrix with high-density, in order to increase a parallelism of the test boards and thus performance of the test.

During their operation, the electronic devices generate heat that causes a heating thereof. Particularly, this heating is remarkable in the case of high power electronic devices. In any case, the increasing miniaturization of the electronic devices significantly increases their heating. An excessive heating of the electronic devices reduces their performance and may lead to wear, malfunction or even breakage of the electronic devices. Therefore, heat sinks are generally provided to dissipate the heat as much as possible from the electronic devices. Particularly, in case the electronic devices (at high power and/or miniaturization) generate a large amount of heat, their cooling by air (by either natural convection or forced ventilation) may not be sufficient to ensure their proper operation. For this reason, in the last years there has been a wide diffusion of complex cooling systems, such as of heat-pipe or liquid type, being capable of providing a high cooling capacity.

However, the use of such cooling systems during the test is difficult (if not impossible).

Indeed, the high density of the sockets in the test boards may prevent the application of the cooling systems to the electronic devices housed thereon. Moreover, the cooling systems may hinder or even prevent the automatic loading/unloading of the electronic devices to/from the test boards (with a deleterious effect on the performance of the tests).

In any case, the cooling systems (due to their size) act at global level on all the electronic devices housed on each test board. However, the electronic devices (even if of the same type) are subject to uneven heating (with differences of the order of 40-60%). This makes it difficult to control the temperature of the electronic devices accurately, and in any case it prevents applying the same thermal stress to the electronic devices (with resulting reduction of the reliability of the tests).

All of the above has negative effects on the effectiveness of the tests of the electronic devices, which affects the quality of their production process.

SUMMARY

A simplified summary of the present invention is herein presented in order to provide a basic understanding thereof however, the sole purpose of this summary is to introduce some concepts of the invention in a simplified form as a prelude to its following more detailed description, and it is not to be interpreted as an identification of its key elements nor as a delineation of its scope.

In general terms, the present invention is based on the idea of conditioning the electronic devices thermally in an individual manner via corresponding extensible elements.

Particularly, an aspect provides a thermal conditioning device, wherein a process heat-conducting fluid is caused to circulate in a plurality of extensible elements; a pressure of the process heat-conducting fluid is regulated to lengthen the extensible elements so that they are pressed against corresponding electronic devices under test to condition them thermally.

A further aspect provides a test apparatus comprising this thermal conditioning device.

A further aspect provides a corresponding method for conditioning electronic devices under test thermally.

A further aspect provides a corresponding method for testing electronic devices.

More specifically, one or more aspects of the present invention are set out in the independent claims and advantageous features thereof are set out in the dependent claims, with the wording of all the claims that is herein incorporated verbatim by reference (with any advantageous feature provided with reference to any specific aspect that applies mutatis mutandis to every other aspect).

BRIEF DESCRIPTION OF THE DRAWINGS

The solution of the present invention, as well as further features and the advantages thereof, will be best understood with reference to the following detailed description, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes, like value, content and representation). In this respect, it is expressly intended that the drawings are not necessary drawn to scale (with some details that may be exaggerated and/or simplified) and that, unless otherwise indicated, they are merely used to illustrate the described structures and procedures conceptually. Particularly.

DETAILED DESCRIPTION

Figure 1:
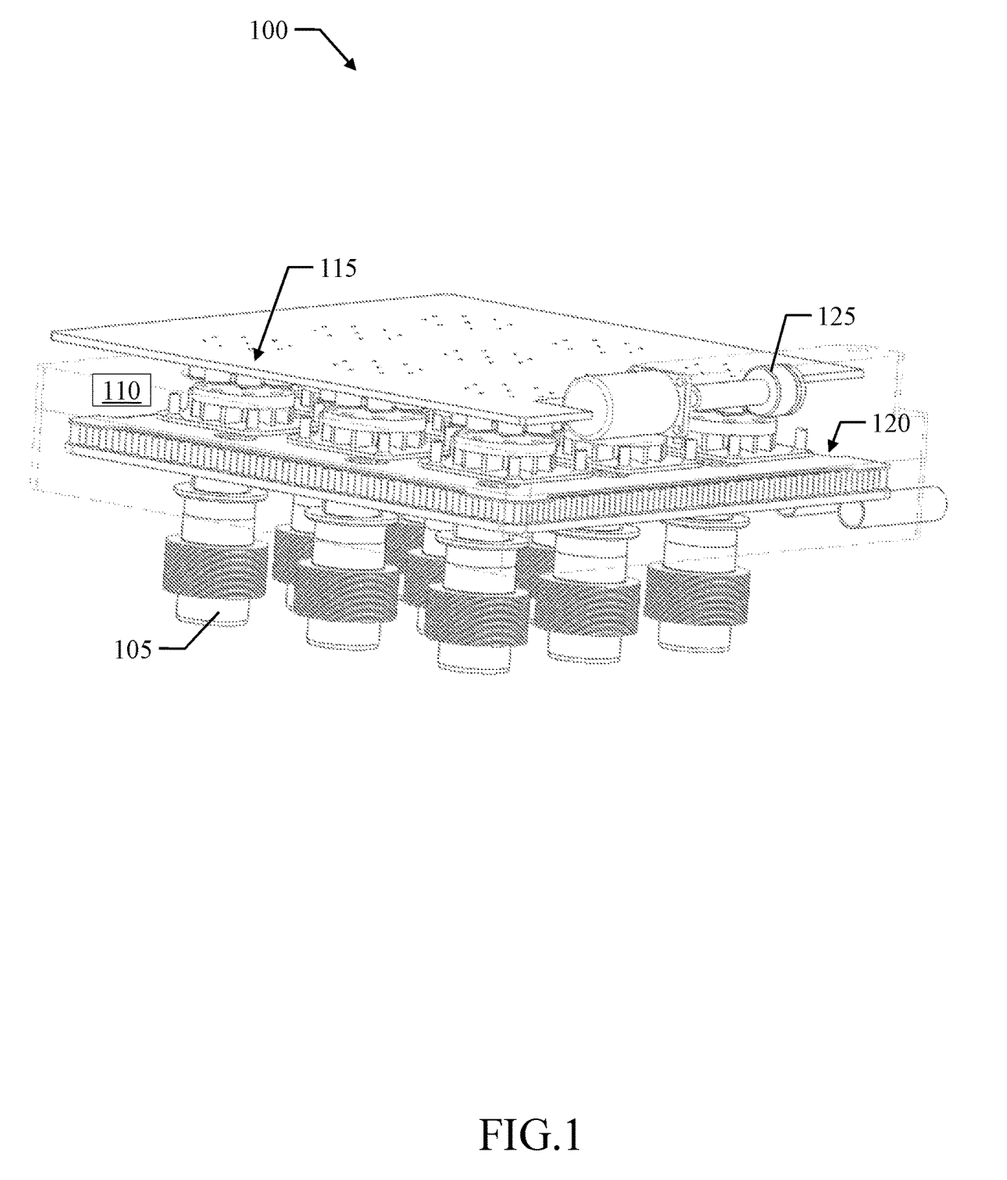
FIG. 1 shows an illustrative representation with phantom parts of a thermal conditioning device according to an embodiment of the present invention.

With reference in particular to FIG. 1, an illustrative representation (with phantom parts) is shown of a thermal conditioning device 100 according to an embodiment of the present invention.

The thermal conditioning device 100 is used to thermally condition a plurality of electronic devices under test (DUTs) housed on corresponding test board sockets (not shown in the figure). The thermal conditioning device 100 comprises the following components.

A plurality of extensible elements 105 (for example, bellow-like) are used to condition the electronic devices thermally in an individual manner, for example, by cooling them during a test thereof. Each extensible element 105 has a variable length, so that it may lengthen and shorten. The extensible elements 105 are arranged in a matrix (for example, with 2-10 rows and 5-20 columns only partially represented in the figure), with a pitch of 3.0-4.0 cm (or more). For each electronic device, a corresponding extensible element 105 is provided (for cooling it when in contact therewith). A process fluid 110 is caused to circulate in the extensible elements 105. The process fluid 110 is a heat-conducting substance in the liquid state (for example, a mixture of water and glycol), which accumulates and conveys heat from the electronic devices (cooling them). The circulation of the process fluid 110 in the extensible elements 105 is achieved by means of a (process) circulation system 115, for example, based on corresponding impellers (described in detail in the following). A (process) heat exchange system, for example, a heat exchanger 120 exchanges heat with the process fluid 110 (transferring the heat absorbed from the electronic devices). A pressure regulation system, for example, a piston 125 is used to regulate a pressure of the process fluid 110. This allows moving the extensible elements 105 between a shortened condition (low pressure) and a lengthened condition (high pressure). As described in detail in the following, at rest the extensible elements 105 are shortened, whereas during the test the extensible elements 105 are lengthened to be pressed against the corresponding electronic devices.

The above-described solution allows conditioning the electronic devices thermally (for example, by cooling them) in an effective manner even during the test.

Particularly, the thermal conditioning device 100 may be applied to the electronic devices even when the test board whereon they are housed has a high density of the sockets (even with a pitch of a few tens of millimeters). Moreover, the thermal conditioning device 100 does not substantially hinder the automatic loading/unloading of the electronic devices to/from the test board (so that it does not affect the performance of the tests).

The pressure exerted by the process fluid 110 significantly improves a mechanical coupling, and thus a heat exchange, between the extensible elements 105 and the electronic devices 205.

All of the above has positive effects on the effectiveness of the tests of the electronic devices, which reflects on the quality of a production process thereof.

Figure 2:
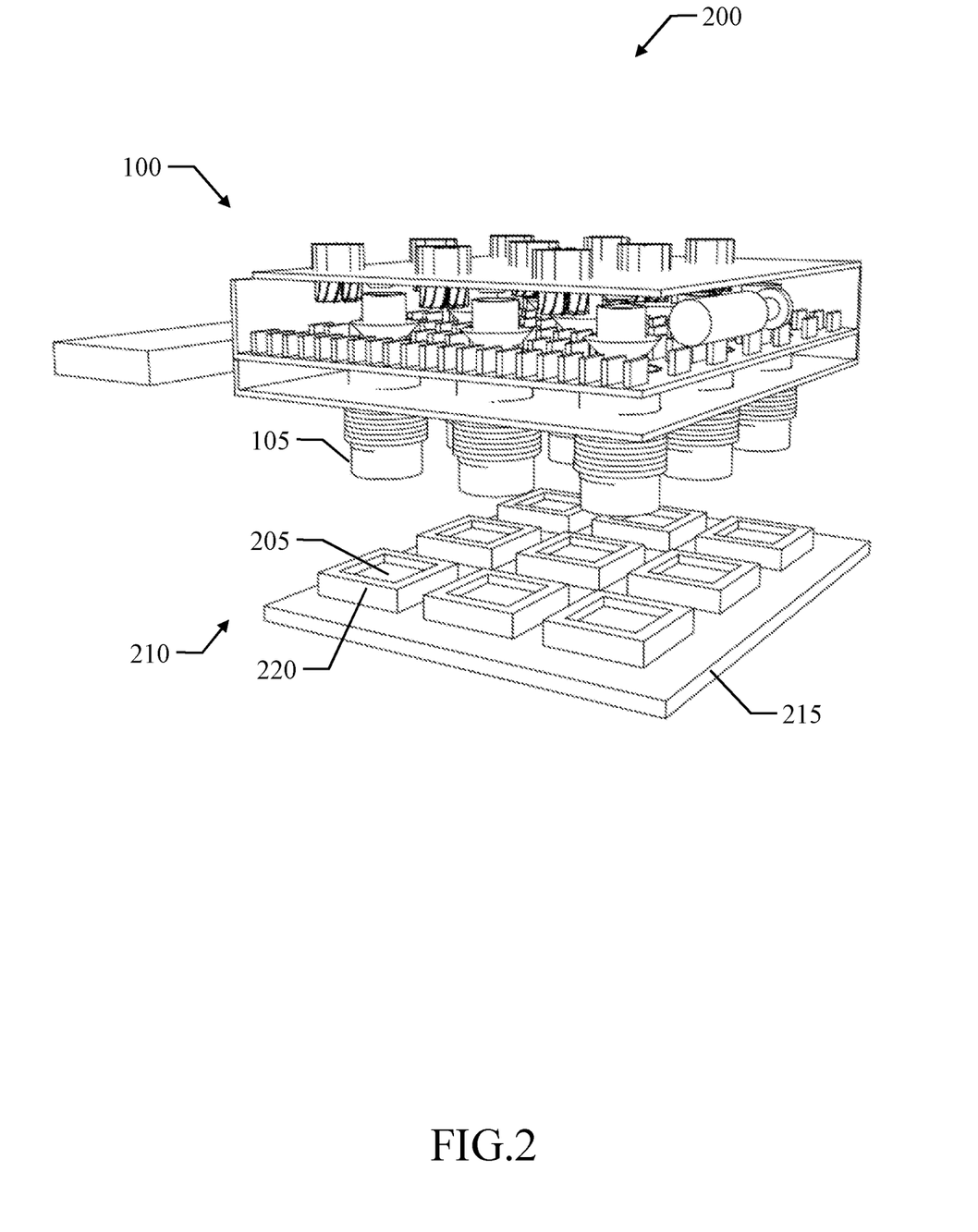
FIG. 2 shows an illustrative representation in partially cutaway view of a test apparatus according to an embodiment of the present invention.

With reference now to FIG. 2, an illustrative representation in partially cutaway view is shown of a test apparatus 200 according to an embodiment of the present invention.

The test apparatus 200 is used to test electronic devices, denoted with the reference 205, at package level; for example, the electronic devices 205 are subject to a burn-in test (wherein the electronic devices 205 are tested under thermal stress conditions). For this purpose, the test apparatus 200 comprises a test board 210 (for housing electronic devices 205 temporarily) and the conditioning device 100 of above (for conditioning the electronic devices 205 housed on the test board 210 thermally). Generally, a test plant (not shown in the figure) accommodates several instances of the test apparatus 200, together with corresponding driving boards (arranged in a control area maintained at room temperature and connected to the corresponding test apparatus 200 to supply them and to exchange signals) and a loader/unloader (for loading/unloading the electronic devices 205 from the test boards 210).

Particularly, the test board 210 comprises the following components.

A holder 215 of circuitized insulating material (for example, a printed circuit board, or PCB) has a function of mechanical support and electrical connection for the other components of test board 210. A plurality of sockets 220 (only partially represented in the figure) are mounted on a main (upper in the figure) surface of the holder 215. The sockets 220 are arranged with a geometry corresponding to the one of the extensible elements 105 (so that when the test board 210 and the conditioning device 100 are coaxial (with test board 210 under the conditioning device 100 in the figure), the sockets 220 are aligned with the corresponding extensible elements 105. Each socket 220 is used to house an electronic device 205 in a removable manner. Particularly, the socket 220 locks the electronic device 205 mechanically (by acting on its package) and connects the electronic device 205 electrically to the electrical circuit of the holder 215 (by contacting its terminals); at the same time, the socket 220 allows releasing the electronic device 205 mechanical (for removing it from the test board 210 without any substantial damage). For example, the socket 220 is based on a platform for resting the electronic device 205, with conductive pads for receiving the terminals of the electronic device 205; a lid, with a window for leaving the package of the electronic device 205 accessible, is hinged to the base, so that it may be closed and opened (to lock and to release, respectively, the electronic device 205).

Figure 3:
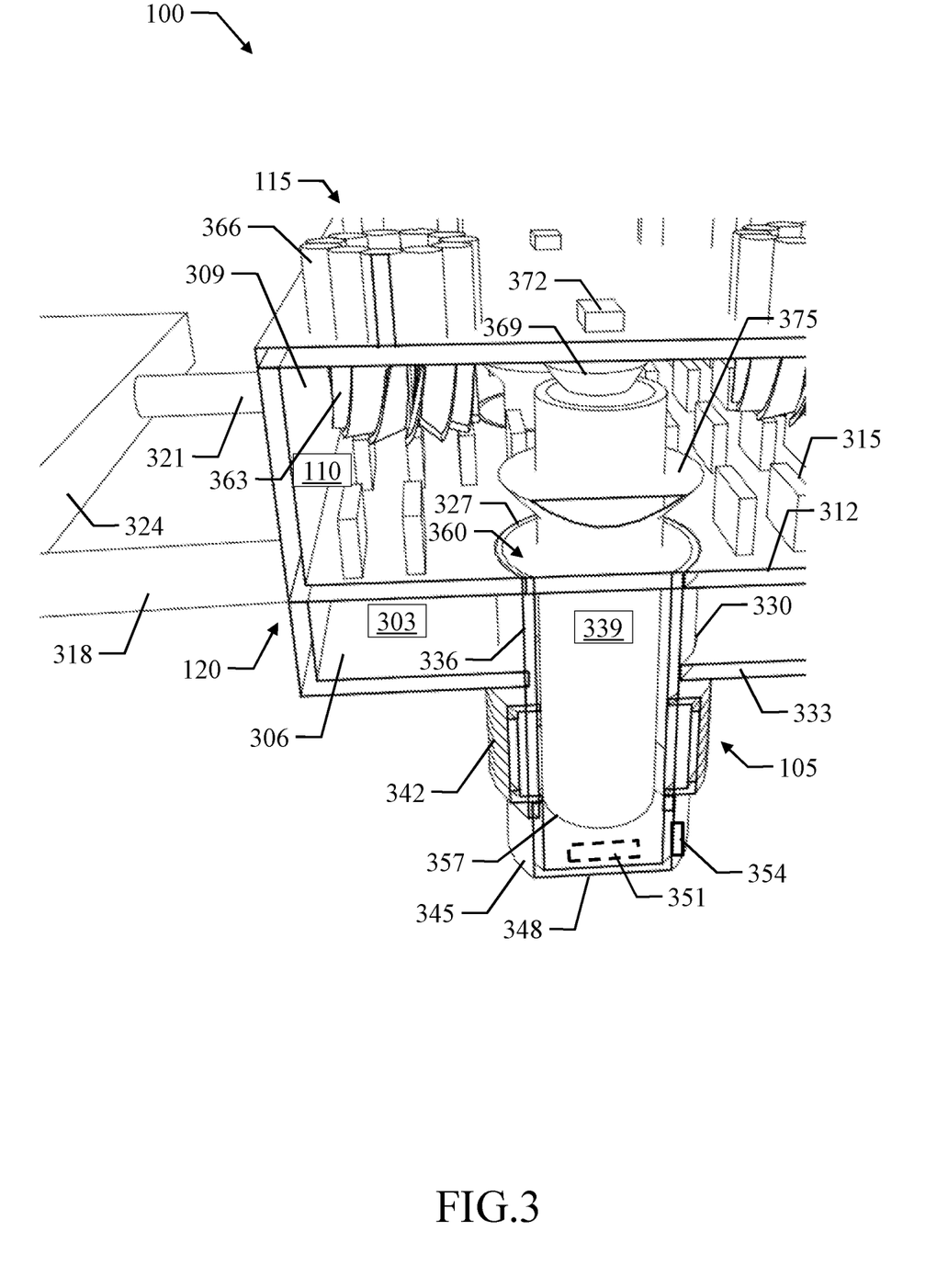
FIG. 3 shows a cross-section view of a detail of the thermal conditioning device according to an embodiment of the present invention.

With reference now to FIG. 3, a cross-section view is shown of a detail of the thermal conditioning device 100 according to an embodiment of the present invention.

The heat exchanger 120 achieves a heat exchange between the process fluid 110 and a service fluid 303 (a similar heat-conducting substance in the liquid state, for example, still a mixture of water and glycol). The heat exchange takes place indirectly through a surface separating distinct compartments wherein the process fluid 110 and the service fluid 303 circulate (so that they are not in contact with each other). Particularly, a (service) chamber 306 contains the service fluid 303 and a (process) chamber 309 contains the process fluid 110. The service chamber 306 and the process chamber 309 have a (heat exchange) wall 312 in common. For this purpose, the wall 312 is made of thermally conductive material (for example, copper); in addition, the 312 wall is equipped with fins 315 facing the process chamber 309 to further facilitate the heat exchange with the process fluid 110. A delivery pipe 318 (or more) and a suction pipe 321 (or more) connect the service chamber 306 to a (service) heat exchange system, for example, a chiller 324 being common to all the test apparatus in the test plant (not shown in the figure), which exchanges heat with the service fluid 303 (transferring the heat absorbed by the process fluid 110).

The following components are provided for each extensible element 105. A pair of (equal and coaxial) holes 327 and 330 are formed in the wall 312 and in a (working) wall 333 of the service chamber 306 opposite thereto, respectively. A sleeve 336 with a section matching the holes 327.330 crosses the service chamber 306 between them; an edge of the sleeve 336 is sealed to an edge of the hole 327 and another edge of the sleeve 336 protrudes beyond the wall 333 (to which a side surface of the sleeve 336 is sealed at the hole 330). In this way, the sleeve 336 defines a through-hole 339 that crosses the service chamber 306 between the walls 312 and 333. A bellow 342 has an edge attached to the edge of the sleeve 336 protruding from the wall 333. The bellow 342 is flexible (for example, accordion-like foldable), so that it may be lengthened and shortened. A cup 345 has an edge attached to another edge of the bellow 342. The sleeve 336, the bellows 342 and the cup 345 define the extensible element 105. In this way, the extensible element 105 extends from the process chamber 309 across the through-hole 339 of the service chamber 306, with a base of the cup 345 protruding beyond the wall 333 to define a contact surface 348 with the corresponding electronic device (not shown in the figure). A heating element 351 is arranged at the contact surface 348 to heat the electronic device (for example, made by means of a coil of electrically conductive material, such as constantan, embedded in the base of the cup 345). A temperature sensor 354 is associated with the contact surface 348 (for example, arranged on the outside of the cup 345 next to it) to detect a temperature of the electronic device. The heating element 351 and the (temperature) sensor 354 are electrically connected to the control board, for example, via holes made in screw stems for mechanical coupling between the process chamber 309 and the service chamber 306 (not shown in the figure). A delivery pipe 357 extends along the extensible element 105, with an (upper) inlet protruding above the wall 312 and a (lower) outlet near the base of the cup 345. In this way, a delivery pipe 360 is defined between the suction pipe 357 and a sidewall of the extensible element 105. For each extensible element 105, the circulation system 115 comprises an impeller 363 and an electromagnets crown 366. The impeller 363 (for example, of tangential type) is arranged in a suction chamber, not shown in the figure, for sucking the process fluid 110 from the process chamber 309 and for conveying it into the delivery pipe 357 (in the direction perpendicular to its longitudinal axis). The electromagnets crown 366 is arranged coaxial with the impeller 363 outside the process chamber 309 to operate (without mechanical coupling) the impeller 363, which in turn is equipped with permanent magnets (not shown in the figure).

A block valve is arranged at the (upper) inlet of the delivery pipe 357 (to block an inflow of the process fluid 110 to the suction pipe 357 when the impeller 363 is stopped). The block valve if formed by a cap, or pin, 369 (with flared profile) and by an electromagnet 372. The cap 369 is located above the inlet of the delivery pipe 357 in the process chamber 309 (mounted on a corresponding vertical guide, not shown in the figure); the cap 369 has a specific weight higher than the one of the process fluid 110, so that it is kept lowered onto the inlet of the suction pipe 357 by gravity. The electromagnet 372 is placed over the cap 369 outside the process chamber 309 to lift the cap 369 by acting on a permanent magnet embedded therein (not shown in the figure). A block valve 375 is arranged at an (upper) outlet of the suction pipe 360 (to block an outflow of the process fluid 110 from the suction pipe 360 due to natural convection when the impeller 363 is stopped). The block valve 375 is formed by a ring (with flared profile) fitted on the suction pipe 357; the block valve 375 has a specific weight higher than the one of the process fluid 110, so that it is kept lowered on the outlet of the suction pipe 360 by gravity as well when it is not pushed upwards by the hydraulic head of the flow of the process fluid 110 generated by the rotation of the impeller 363.

With reference now to FIG. 4A-FIG. 4E, the main steps are shown of a test process according to an embodiment of the present invention.

Figure 4A:
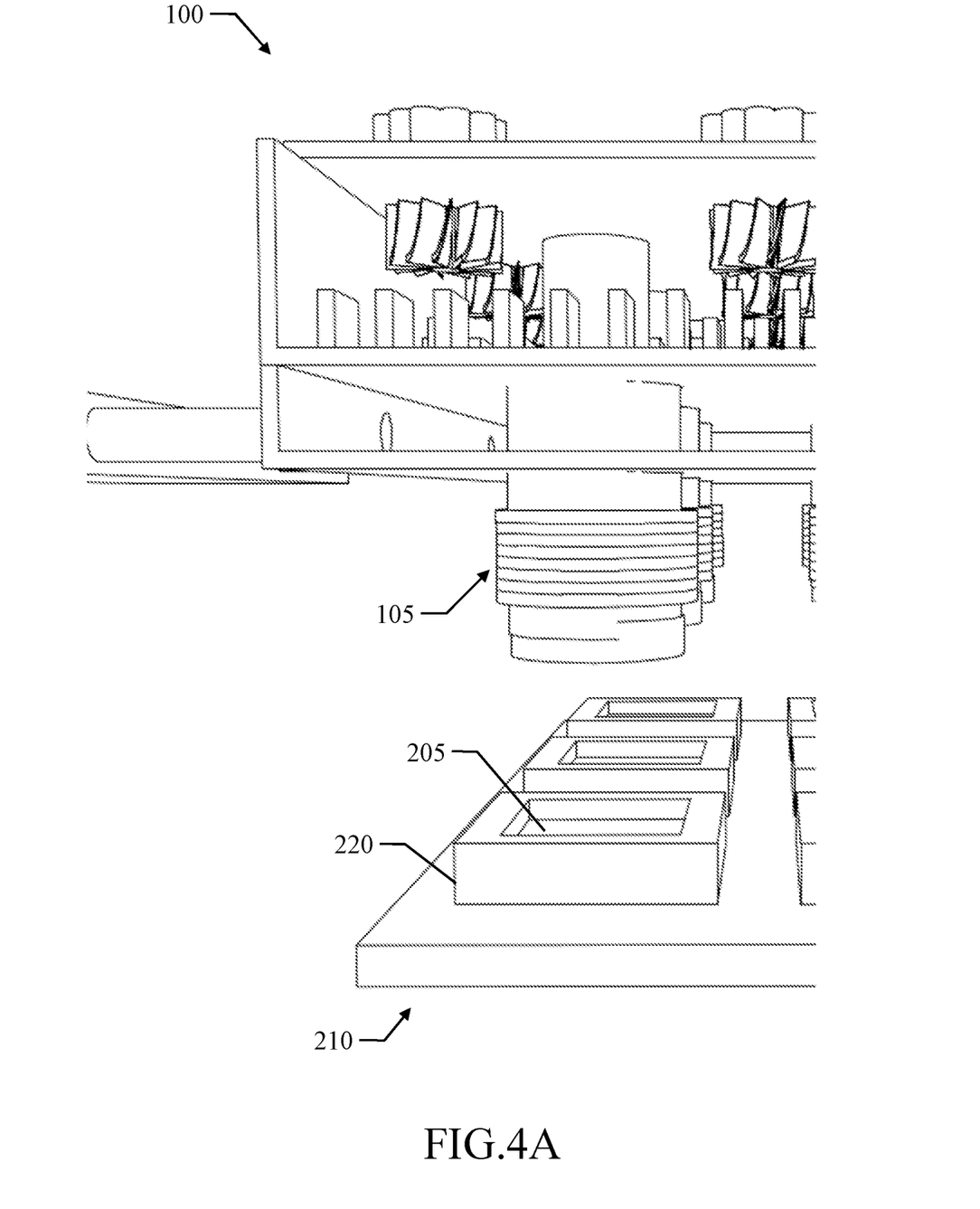
FIG. 4A-FIG. 4E show the main steps of a test process according to an embodiment of the present invention.

Starting from FIG. 4A, at the beginning of the test (not shown in the figures), the electronic devices 205 are transported in a tray close to the loader/unloader, which is in front of the test board 210 moved away laterally from the thermal conditioning device 100. The loader/unloader collects the electronic devices 205 from the tray and deposits them onto the (open) sockets 220 in succession. Once the test board 210 has been filled (totally or partially), the sockets 220 are closed and the test board 210 is moved back under the thermal conditioning device 100, as shown in the figure, so that each electronic device 205 is aligned with the corresponding extensible element 105.

Figure 4B:
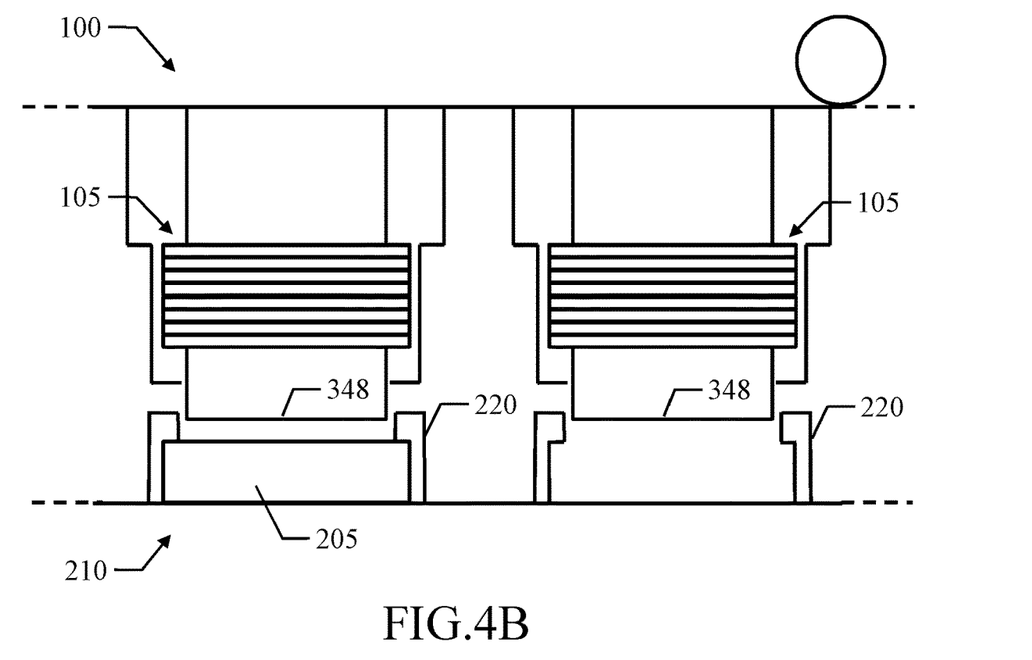

Moving on to FIG. 4B, at this point the heat conditioning device 100 and the test board 210 are caused to approach (for example, by lowering the heat conditioning device 100). The approaching is such that, where the corresponding electronic devices 205 are present in the sockets 220 (as shown on the left in the figure), each extendible element 105 moves close to the electronic device 205, with its contact surface 348 at a corresponding approaching distance (for example, 0-1 mm). Therefore, should no electronic devices 205 be present in the corresponding sockets 220 (as shown on the right in the figure), each extensible element 105 remains spaced apart from the bottom of the (empty) socket 220, with its contact surface 348 at a distance equal to the approaching distance plus a thickness of the electronic devices 205 (for example, for a total of 1-2 cm).

Figure 4C:
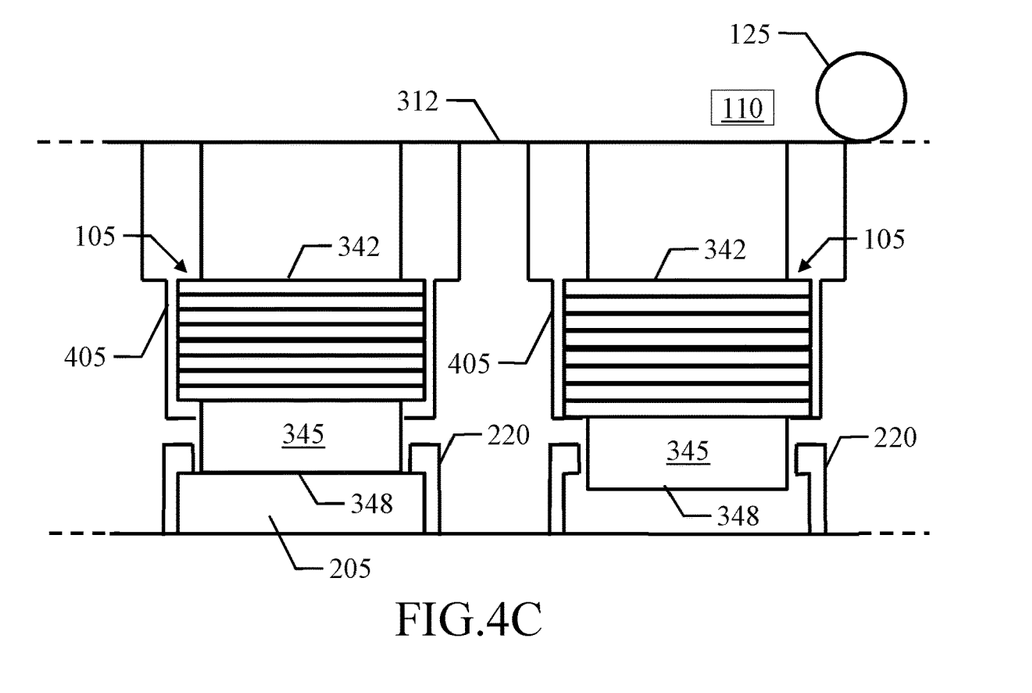

Moving to FIG. 4C, the piston 125 is operated to increase the pressure of the process fluid 110. As a consequence, where the corresponding electronic devices 205 are present in the sockets 220 (as shown on the left in the figure), each extensible element 105 is lengthened (for example, by 1-2 mm) until it abuts against the electronic device 205, thereby pressing the contact surface 348 against it (directly or through an elastic insert, of thermally conductive material, not shown in the figure). Particularly, the bellow 342 is capable of adapting even in case the contact surface 348 and the electronic device 205 are not perfectly parallel; this ensures their good mechanical coupling in any situation, further improving the heat exchange.

On the other hand, should no electronic devices 205 be present in the corresponding sockets 220 (as shown on the right in the figure), each extensible element 105 would lengthen without any abutment, at least until the contact surface 348 reaches the bottom of the (empty) socket 220. Therefore, in an embodiment of the invention a limitation system is provided to limit the elongation of the extensible elements 105, for example, comprising a corresponding limiting element 405 for each extensible element 105. The limiting element 405 is formed by a vessel fixed under the wall 312 around the extensible element 105. The limiting element 405 extends slightly beyond the bellow 342 when the extensible element 105 is in the shortened condition, by a length exceeding the approaching distance of above (for example, 1.2-2.0 times if not zero and at least equal to 1-2 mm in any case). A hole is made in the bottom of the limiting element 405. The hole has a diameter matching the cup 345 to allow its passage (so that the contact surface 348 protrudes beyond the limiting element 405); the hole is instead narrower than the bellow 342 (wider than the cup 345), so that the remaining part of the bottom of the limiting element 405 (outer edge) defines an abutment for the bellow 342.

Therefore, where the corresponding electronic devices 205 are present in the sockets 220, each extensible element 105 lengthens as above (with the cup 345 sliding in the hole of the limiting element 405 (so that it does not interfere in any way with the operation of the extensible element 105). On the contrary, where no electronic device 205 is present in the corresponding sockets 220, each extensible element 105 lengthens but only until the bellow 342 abuts against the abutment of the limiting element 405. This avoids, or at least significantly reduces, the risk of damage of the bellow 342.

Figure 4D:
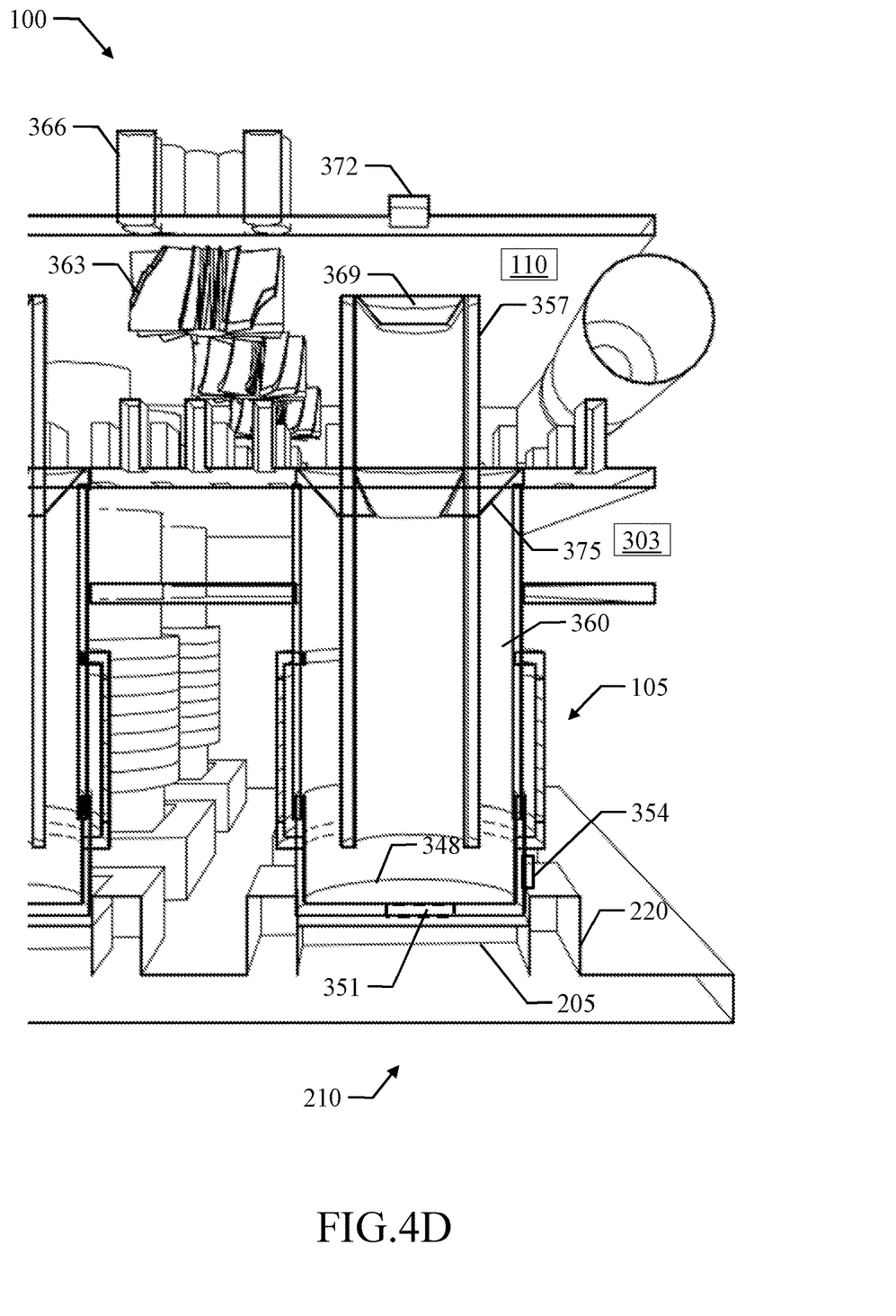

Moving to FIG. 4D, at the beginning all the heating elements 351 are switched off, all the electromagnets crowns 366 are switched off so that all the impellers 363 are stopped, all the electromagnets 372 are switched off so that all the caps 369 are lowered on the suction pipes 357 by gravity force (suction valves 369,372 being closed) and all the delivery valves 375 are lowered on the delivery pipes 360 by gravity force (closed). A lower threshold temperature and an upper threshold temperature define a regulation range around a target temperature to be maintained for the electronic devices 205 during the test (for example, ±5-10° C.).

For each electronic device 205, the driving board (not shown in the FIG. monitors its (actual) temperature detected by the sensor 354. If the actual temperature is lower than the lower threshold temperature, the driving board activates the heater element 351 (with power increasing with a distance of the actual temperature from the lower threshold temperature, for example, by applying a voltage of 12-24 V to generate 0.1-10 kJ of heat by Joule effect). The heating element 351 increases the temperature of the contact surface 348 and thus of the electronic device 205. As soon as the actual temperature exceeds the lower threshold temperature, the driving board deactivates the heating element 351.

Figure 4E:
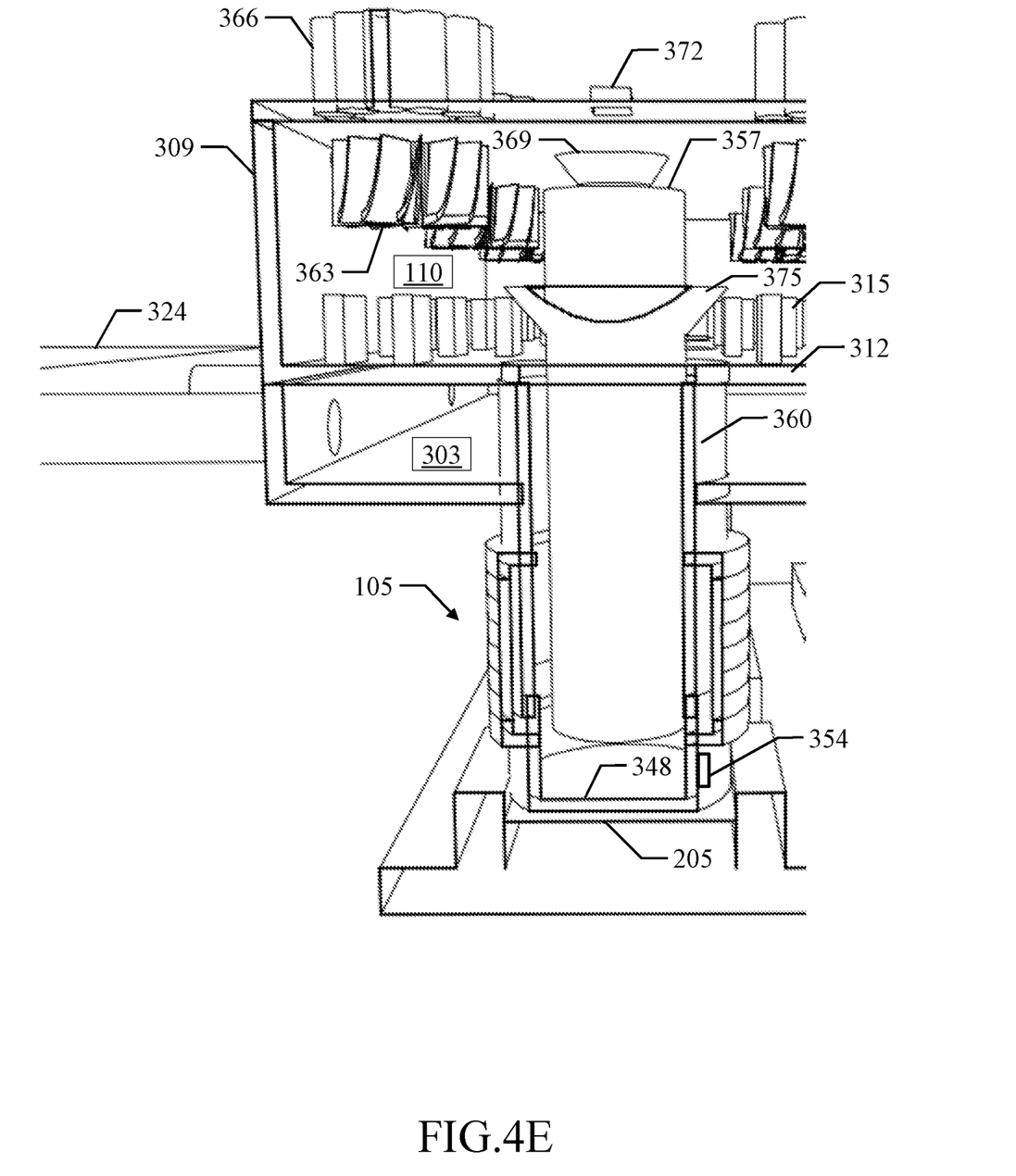

Moving to FIG. 4E, if the actual temperature (detected by the sensor 354) is higher than the upper threshold temperature, the driving board (not shown in the figure) activates the electromagnet 372 to lift the cap 369 in opposition to the force of gravity (delivery valve 369,372 being open), thus clearing the inlet of the delivery pipe 357. The driving board then activates the electromagnets crow 366 to make the impeller 363 rotate (at an angular speed increasing with a distance of the actual temperature from the upper threshold temperature, for example, 5-20 rpm). In this way, the impeller 363 sucks the process fluid 110 from the process chamber 309 and conveys it into the delivery pipe 357 towards the contact surface 348. The process fluid 110 decreases the temperature of the contact surface 348 and then of the electronic device 205; particularly, the cooling of the electronic device 205 depends on the flow rate of the process fluid 110, which in turn depends on the angular speed of the impeller 363 (with the cooling increasing with the angular speed). The (heated) process fluid 110 goes back up in the suction pipe 360; the flow of the process fluid 110 lifts the suction valve 375 against the force of gravity (opening it), thereby clearing the outlet of the suction pipe 360. The process fluid 110 may thus return from the suction pipe 360 into the process chamber 309. The process fluid 110 laps the wall 312 (and particularly its fins 315) thereby cooling down (at the expense of the service fluid 303, which heats up and is then cooled by the chiller 324, which in turn disperses the heat into the external environment).

Returning to FIG. 4D, as soon as the actual temperature falls below the upper threshold temperature, the driving board deactivates the electromagnets crown 366, so that the impeller 363 stops. Moreover, the driving board deactivates the electromagnet 372, so that the cap 369 falls by gravity onto the delivery pipe 357 (block valve 369,372 being closed), thereby obstructing its inlet. As a result, the flow of the process fluid 110 in the suction pipe 357 and then in the delivery pipe 360 is lacking, so that the delivery valve 375 falls by gravity onto the suction pipe 360 (closing), thus obstructing its outlet. The block valve 369,372 and the suction valve 375 block any convective motion of the process fluid 110 in the extensible element 105, thus avoiding further cooling of the electronic device 205.

In this way, the temperature of each electronic device 205 may be controlled individually with precision (with a hysteresis control); particularly, the same thermal stress may be applied to the electronic devices 205, even when they are subject to non-uniform heating (with resulting increase of the reliability of the tests).

This result is achieved in a simple and effective manner by using a single service fluid 303 for all the extensible elements 105. Particularly, the service fluid 303 may be conditioned (as a function of the power dissipated by the electronic devices 205) to a temperature so as to center, around the target temperature, the control range of the temperature under the action of the impeller 363 and the heating element 351 (so as to limit their intervention as much as possible).

In this way, the electronic devices 205 may be tested by the driving board (sending stimulus signals and receiving corresponding result signals) while their temperature is maintained at the desired value.

At the end of the test (not shown in the figures), the above-described operations are repeated in reverse order. Particularly, the test board 210 is brought in front of the loader/unloader (moving it laterally away from the thermal conditioning device 100) and the sockets 220 are opened. The loader/unloader collects the electronic devices 205 from the test board 210 and deposits them onto the tray in succession.

Modifications

Naturally, in order to satisfy local and specific requirements, a person skilled in the art may apply many logical and/or physical modifications and alterations to the present invention. More specifically, although this invention has been described with a certain degree of particularity with reference to one or more embodiments thereof, it should be understood that various omissions, substitutions and changes in the form and details as well as other embodiments are possible. Particularly, different embodiments of the present invention may be practiced even without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present invention may be incorporated in any other embodiment as a matter of general design choice. Moreover, items presented in a same group and different embodiments, examples or alternatives are not to be construed as de facto equivalent to each other (but they are separate and autonomous entities). In any case, each numerical value should be read as modified according to applicable tolerances; particularly, unless otherwise indicated, the terms "substantially", "about", "approximately" and the like should be understood as within 10%. Moreover, each range of numerical values should be intended as expressly specifying any possible number along the continuum within the range (comprising its end points). Ordinal or other qualifiers are merely used as labels to distinguish elements with the same name but do not by themselves connote any priority, precedence or order. Moreover, the terms include, comprise, have, contain, involve and the like should be intended with an open, non-exhaustive meaning (i.e., not limited to the recited items), the terms based on, dependent on, according to, function of and the like should be intended as a non-exclusive relationship (i.e., with possible further variables involved), the term a/an should be intended as one or more items (unless expressly indicated otherwise), and the term means for (or any means-plus-function formulation) should be intended as any structure adapted or configured for carrying out the relevant function.

For example, an embodiment provides a thermal conditioning device. However, the thermal conditioning device may be used to apply any type of thermal conditioning (for example, cooling, heating, cooling/heating to any temperature, and so on).

In an embodiment, the thermal conditioning device may be used for conditioning a plurality of electronic devices under test thermally. However, the electronic devices may be in any number and of any type (for example, based on integrated circuits and/or discrete components, provided in any type of package, with any number and type of terminals, and so on), and they may be subject to any type of test (for example, reliability, functional, parametric, performed under any thermal stress condition or even simply by keeping their temperature within a predetermined range, and so on).

In an embodiment, the thermal conditioning device comprises a plurality of extensible elements with variable length, each for conditioning a corresponding one of the electronic devices thermally in an individual manner. However, the extensible elements may be in any number (for conditioning a corresponding maximum number of electronic devices thermally) and of any type (for example, bellow-like, telescopic, elastic, and so on).

In an embodiment, the thermal conditioning device comprises a process circulation system for circulating a process heat-conductive fluid in the extensible elements. However, the process circulation system may be of any type (for example, for controlling the circulation of the process heat-conductive fluid individually in each extensible element or globally, for pushing and/or sucking the process fluid in the extensible elements, and so on) and using any process heat-conductive fluid (for example, liquid, gas, and so on).

In an embodiment, the thermal conditioning device comprises a process heat exchange system for exchanging heat with the process heat-conductive fluid. However, the process heat exchange system may be of any type (for example, global for all extensible elements, with distinct components each for a set of one or more of the extensible elements, liquid-based, oil-based, air-based and so on).

In an embodiment, the thermal conditioning device comprises a pressure regulation system for regulating a pressure of the process heat-conducting fluid. However, the pressure regulation system may be of any type (for example, mechanical, hydraulic, and so on) for regulating the pressure of the process heat-conducting fluid in any way (for example, by simply activating/deactivating it, setting the pressure to any value selected in a continuous/discrete manner, and so on).

In an embodiment, the regulation of the pressure is used to move the extensible elements between a shortened condition and a lengthened condition. However, the shortened condition and the lengthened condition may be defined in any way (for example, with the extensible elements in the shortened condition that are separated from the electronic devices at any distance or are already in contact with them, with the lengthened condition defined by any lengthening with respect to the shortened condition, and so on).

In an embodiment, each of the extensible elements in the lengthened condition is pressed against the corresponding electronic device. However, the extensible elements may be pressed against the electronic devices with any force (for example, fixed, adjustable, and so on).

Further embodiments provide additional advantageous features, which may however be omitted at all in a basic implementation.

Particularly, in an embodiment the process circulation system comprises a plurality of process circulation elements, each for circulating the process heat-conductive fluid in a corresponding one of the extensible elements. However, the process circulation elements may be of any type (for example, tangential, circumferential or axial impellers, suction pumps, and so on, driven by corresponding electromagnets crowns, solenoid coils crowns directly integrated into a multilayer printed circuit board, and so on).

In an embodiment, the process circulation elements are controllable individually to regulate a flow rate of the process heat-conductive fluid independently in the corresponding extensible elements. However, the process circulation elements may be controlled individually in any way (for example, on/off, with flow rate regulated according to any law, such as based on any linear or non-linear function of the distance from the target temperature or of the approach rate thereto, and so on) by any control system (for example, corresponding control board, central computer of the whole test plant, and so on).

In an embodiment, the thermal conditioning device comprises a plurality of blocking devices each for blocking a convective motion of the process heat-conducting fluid in a corresponding one of the extensible elements in a deactivated condition of the corresponding process circulation element. However, the blocking devices may be of any type (for example, input and/or output, active, passive, and so on) or they may also be omitted at all.

In an embodiment, the thermal conditioning device comprises a plurality of heating elements, each arranged in a corresponding one of the extensible elements for heating the corresponding electronic device. However, the heating elements may be of any type (for example, based on Joule effect, magnetic induction, and so on) or they may be omitted at all.

In an embodiment, the heating elements are controllable individually to heat the corresponding electronic devices independently. However, the heating elements may be controlled individually in any way (for example, on/off, with power controlled according to any law, such as based on any linear or non-linear function of the distance from the target temperature or of the approach rate thereto, and so on) by any control system (either the same or different with respect to above); in any case, the possibility of controlling the heating elements globally is not excluded.

In an embodiment, the thermal conditioning device comprises a plurality of temperature sensors each for detecting a temperature of a corresponding one of the electronic devices. However, the temperature sensors may be of any type and arranged in any position; in any case, the possibility is not excluded of having fewer temperature sensors, each associated with several electronic devices (down to one for all), or even of omitting them completely.

In an embodiment, the process circulation elements and/or the heating elements are controllable according to the temperature of the corresponding electronic devices. However, it is possible to control only the process circulation elements, only the heating elements or both of them in any way according to the temperature of the corresponding electronic devices (for example, based on their value or their variation over time, with any linear or non-linear law, and so on).

In an embodiment, the thermal conditioning device comprises a thermal coupling element for exchanging heat between the process heat-conductive fluid and a service heat-conductive fluid. However, the thermal coupling element may be of any type (for example, based on plate or tubes, with the fluids in co-current, counter-current or cross-current, and so on) to exchange heat with any service heat-conductive fluid (equal to or different from the process heat-conductive fluid).

In an embodiment, the thermal conditioning device comprises a service heat exchange system for exchanging heat with the service heat-conductive fluid. However, the service heat exchange system may be of any type (for example, a chiller, a heat pump, and so on).

In an embodiment, the thermal conditioning device comprises a process chamber for containing the process heat-conductive fluid and a service chamber for containing the service heat-conductive fluid. However, the process chamber and service chamber may be of any material, shape and size (equal to or different from each other).

In an embodiment, the process chamber and the service chamber are separated by a heat exchange wall. However, the heat exchange wall may be of any material, shape and size (for example, with any number and type of fins, without fins, and so on).

In an embodiment, the service chamber is crossed by a plurality of through-holes extending from the heat exchange wall to an operative wall opposite the heat exchange wall. However, the through holes may be of any shape, size and type (for example, defined by the extensible elements, integrated in the service chamber independently of the extensible elements, and so on).

In an embodiment, the extensible elements extend from the process chamber each crossing a corresponding one of the through holes, from the heat exchange wall to the operative wall, with a contact surface of the extensible element protruding from the operative wall for contacting the corresponding electronic device. However, the extensible elements may protrude from the operative wall at any distance with any contact surface thereof (for example, flat, convex, rigid, elastic, for direct/indirect contact, and so on).

In an embodiment, the process circulation system is configured for circulating the process heat-conductive fluid in each of the extensible elements from the process chamber to the contact surface and from the contact surface to the heat exchange wall. However, the process fluid may be caused to circulate in the extensible elements in any way (for example, along any predefined path, indiscriminately, and so on).

In an embodiment, the thermal conditioning device comprises a plurality of suction pipes of the process heat-conducting fluid each extending in a corresponding one of the extensible elements from the process chamber to a position proximal to the contact surface. However, each suction pipe may be of any shape and size, and it may extend in any way in the corresponding extensible element (for example, protruding beyond the heat exchange wall at any distance even zero, stopping at any distance from the contact surface even zero if provided with one or more side windows in correspondence thereto, and so on).

In an embodiment, the suction pipe is separated from a lateral surface of the extensible element to define a delivery duct of the process heat-conducting fluid. However, the suction pipe may be separated from the sidewall in any way (for example, symmetrically or non-symmetrically, at any distance, and so on).

In an embodiment, each of the blocking devices comprises a suction valve for blocking an inflow of the process heat-conductive fluid from the process chamber to the suction pipe in the deactivated condition of the corresponding process circulation element. However, the suction valve may be of any type (for example, with opening and/or closing control, of cap, butterfly, ball type and so on).

In an embodiment, each of the blocking devices comprises a delivery valve for blocking an outflow of the process heat-conductive fluid from the delivery duct to the process chamber in the deactivated condition of the corresponding process circulation element. However, the delivery valve may be of any type (the same as or different from the suction valve).

In an embodiment, the suction valve is normally closed by force of gravity. However, the suction valve may have any specific weight (higher than the one of the process fluid) for closing the suction pipe with any force.

In an embodiment, the suction valve opens in response to an external command in opposition to the force of gravity. However, the external command may be of any type (for example, magnetic, such as via electromagnet or solenoid coil directly integrated in a multilayer printed circuit, mechanical and so on).

In an embodiment, the delivery valve is normally closed by force of gravity. However, the delivery valve may have any specific weight (higher than the one of the process fluid) for closing the delivery duct with any force.

In an embodiment, the delivery valve opens in response to said circulating the process heat-conductive fluid in opposition to the force of gravity. However, the flow valve may open in response to any pressure exerted by the flow of the process heat-conductive fluid.

In an embodiment, the thermal conditioning device comprises a limitation system for limiting the length of each of the extensible elements when moved towards the lengthened condition in the absence of the corresponding electronic device. However, the limitation system may be of any type (for example, with a limitation element for each extensible element or group of them, unique for all the extensible elements, passive, active and so on) or it may also be omitted at all.

An embodiment provides a test apparatus comprising the thermal conditioning device of above and one or more test boards. However, the test apparatus may comprise any number of test boards of any type.

In an embodiment, each test board has a plurality of sockets each for housing one of the electronic devices in a removable manner. However, each test board may have any number of sockets (equal to or lower than the number of extensible elements of the thermal conditioning device) of any type (for example, pads/holes for receiving the terminals of the electronic devices, based on lid/latch to lock the packages of the electronic devices, and so on).

Generally, similar considerations apply if the thermal conditioning device and the test apparatus each has a different structure or comprises equivalent components (for example, of different materials) or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

An embodiment provides a method for conditioning a plurality of electronic devices under test thermally. The method comprises circulating a process heat-conductive fluid in a plurality of extensible elements with variable length. The method comprises exchanging heat with the process heat-conductive fluid. The method comprises regulating a pressure of the process heat-conducting fluid to move the extensible elements between a shortened condition and a lengthened condition. Each of the extensible elements in the lengthened condition is pressed against the corresponding electronic device for conditioning the electronic device thermally.

An embodiment provides a method for testing a plurality of electronic devices. The method comprises housing the electronic devices on corresponding sockets of one or more test boards in a removable manner. The method comprises conditioning the electronic devices thermally as above. The method comprises testing the electronic devices being conditioned thermally.

Generally, similar considerations apply if the same solution is implemented with an equivalent method (by using similar steps with the same functions of more steps or portions thereof, removing some non-essential steps or adding further optional steps); moreover, the steps may be performed in a different order, concurrently or in an interleaved way (at least in part).

The invention claimed is:

1. A thermal conditioning device for conditioning a plurality of electronic devices under test thermally,
wherein
the thermal conditioning device comprises:
a plurality of extensible elements with variable length each for conditioning a corresponding one of the electronic devices thermally in an individual manner,
a process circulation system for circulating a process heat-conductive fluid in the extensible elements
a process heat exchange system for exchanging heat with the process heat-conductive fluid, and
a pressure regulation system for regulating a pressure of the process heat-conducting fluid to move the extensible elements between a shortened condition and a lengthened condition, each of the extensible elements in the lengthened condition being pressed against the corresponding electronic device.

2. The thermal conditioning device according to claim 1, wherein the process circulation system comprises:
a plurality of process circulation elements each for circulating the process heat-conductive fluid in a corresponding one of the extensible elements the process circulation elements being controllable individually to regulate a flow rate of the process heat-conductive fluid independently in the corresponding extensible elements.

3. The thermal conditioning device according to claim 2, wherein the thermal conditioning device comprises:
a plurality of blocking devices each for blocking a convective motion of the process heat-conducting fluid in a corresponding one of the extensible elements in a deactivated condition of the corresponding process circulation element.

4. The thermal conditioning device according to claim 2, wherein the thermal conditioning device comprises:
a plurality of heating elements each arranged in a corresponding one of the extensible elements for heating the corresponding electronic device (205), the heating elements being controllable individually to heat the corresponding electronic devices independently.

5. The thermal conditioning device according to claim 2, wherein the thermal conditioning device comprises:
a plurality of temperature sensors each for detecting a temperature of a corresponding one of the electronic devices, the process circulation elements and/or the heating elements being controllable according to the temperature of the corresponding electronic devices.

6. The thermal conditioning device according to claim 1, wherein the thermal conditioning device comprises:
a thermal coupling element for exchanging heat between the process heat-conductive fluid and a service heat-conductive fluid, and
a service heat exchange system for exchanging heat with the service heat-conductive fluid.

7. The thermal conditioning device according to claim 6, wherein the thermal conditioning device comprises a process chamber for containing the process heat-conductive fluid and a service chamber for containing the service heat-conductive fluid, the process chamber and the service chamber being separated by a heat exchange wall, wherein the service chamber is crossed by a plurality of through-holes extending from the heat exchange wall to an operative wall opposite the heat exchange wall, the extensible elements extending from the process chamber each crossing a corresponding one of the through holes from the heat exchange wall to the operative wall with a contact surface of the extensible element protruding from the operative wall for contacting the corresponding electronic device, and wherein the process circulation system is configured for circulating the process heat-conductive fluid in each of the extensible elements from the process chamber to the contact surface and from the contact surface to the heat exchange wall.

8. The thermal conditioning device according to claim 3, wherein the thermal conditioning device comprises:
a plurality of suction pipes of the process heat-conducting fluid each extending within a corresponding one of the extensible elements from the process chamber to a position proximal to the contact surface the suction pipe being separated from a lateral surface of the extensible element to define a delivery duct of the process heat-conducting fluid.

9. The thermal conditioning device according to claim 8, wherein each of the blocking devices comprises:
a suction valve for blocking an inflow of the process heat-conductive fluid from the process chamber to the suction pipe in the deactivated condition of the corresponding process circulation element, and/or
a delivery valve for blocking an outflow of the process heat-conductive fluid, from the delivery duct to the process chamber in the deactivated condition of the corresponding process circulation element.

10. The thermal conditioning device according to claim 9, wherein the suction valve is normally closed by force of gravity, the suction valve opening in response to an external command in opposition to the force of gravity.

11. The thermal conditioning device according to claim 9, wherein the delivery valve is normally closed by force of gravity, the delivery valve opening in response to said circulating the process heat-conductive fluid in opposition to the force of gravity.

12. The thermal conditioning device according to claim 1, wherein the thermal conditioning device comprises a limitation system for limiting the length of each of the extensible elements when moved towards the lengthened condition in the absence of the corresponding electronic device.

13. A test apparatus comprising the thermal conditioning device according to claim 1 and one or more test boards having a plurality of sockets each for housing one of the electronic devices in a removable manner.

14. A method for conditioning a plurality of electronic devices under test thermally, wherein the method comprises:
circulating a process heat-conductive fluid in a plurality of extensible elements with variable length,
exchanging heat with the process heat-conductive fluid,
regulating a pressure of the process heat-conducting fluid to move the extensible elements between a shortened condition and a lengthened condition, each of the extensible elements in the lengthened condition being pressed against a corresponding one of the electronic devices conditioning the electronic device thermally.

15. The method of claim 14, further comprising:
housing the electronic devices on corresponding sockets of one or more test boards in a removable manner, and
testing the electronic devices being conditioned thermally.

* * * * *